United States Patent [19]

Shou et al.

[11] Patent Number: 5,737,368
[45] Date of Patent: Apr. 7, 1998

[54] MATCHED FILTER

[75] Inventors: Guoliang Shou; Changming Zhou; Makoto Yamamoto; Sunao Takatori, all of Tokyo, Japan

[73] Assignees: Sharp Kabushiki Kaisha, Osaka; Yozan Inc., Tokyo, both of Japan

[21] Appl. No.: 715,321

[22] Filed: Sep. 17, 1996

[30] Foreign Application Priority Data

Sep. 18, 1995 [JP] Japan .................................. 7-263573

[51] Int. Cl.$^6$ .................................................. H03D 1/00
[52] U.S. Cl. ................................. 375/343; 375/200
[58] Field of Search .................................. 327/94, 95, 91, 327/403; 375/208, 343, 200; 329/310; 370/324, 244

[56] References Cited

U.S. PATENT DOCUMENTS 4,507,746  3/1985  Fletcher, Jr. .
5,408,192  4/1995  Bailey .

FOREIGN PATENT DOCUMENTS 7-94957  4/1995  Japan .

OTHER PUBLICATIONS

G. J. R. Povey and P.M. Grant; "Simplified Matched Filter Receiver Designs for Spread Spectrum Communications Applications; Electronics and Communication Engineering Journal, vol. 5, No. 2; (Apr. 5, 1993); pp. 59–64.

*Primary Examiner*—Stephen Chin
*Assistant Examiner*—Joseph Roundtree
*Attorney, Agent, or Firm*—Cushman, Darby & Cushman IP Group of Pillsbury Madison & Sutro LLP

[57]  ABSTRACT

A matched filter contains a plurality of auxiliary sampling and holding circuits in addition to a main sampling and holding circuit containing multiple unit sampling and holding circuits. An auxiliary sampling and holding circuit is used to hold an input voltage, which would ordinarily be held by a unit sampling and holding circuit, when the unit sampling and holding circuit is being refreshed. By holding a part of the analog input voltage in the auxiliary sampling and holding circuits, refreshing is performed without decreasing the overall calculation speed.

6 Claims, 8 Drawing Sheets

MATCHED FILTER

FIELD OF THE INVENTION

The present invention relates to a matched filter effective for a spread spectrum communication system, such as a mobile cellular radio or a wireless LAN. More particularly, the present invention relates to a matched filter including a main sampling and holding circuit with a plurality of sampling and holding circuit modules parallelly connected to an input voltage for holding the input voltage and a plurality of auxiliary sampling and holding circuits for holding the input voltage while the modules in the main sampling and holding circuits are refreshed.

BACKGROUND OF THE INVENTION

The applicants have proposed a matched filter of this kind in Japanese patent application number 7-212438. Assuming that a PN (Pseudo-Noise) code is a 1 bit code, a circuit for multiplication is simplified by a multiplexer.

FIG. 17 shows the matched filter circuit of JP 7-212438 and FIG. 18 shows a sampling and holding circuit S/H in the matched filter circuit of FIG. 17. In the sampling and holding circuit S/H, an analog input voltage Vin is held in a capacitor C1 and is input to an output terminal VH or VL according whether the PN code is positive or negative (plus or minus). The outputs are added in adders AD1p and AD1m, and then, minus elements are subtracted from plus elements by two steps of inverse addition in elements AD2 and AD3.

In such an analog calculating circuit, an offset voltage is generated by residual charge in the inverter and the capacitor, and consequently, the accuracy of an output becomes worse. To reduce the electrical charge causing the offset voltage, it is necessary to refresh the circuit periodically by short circuiting part of the circuit and dissipate the residual charge. Since it is necessary to stop calculation operations when the circuit is being refreshed, the overall speed of calculation in the circuit must be sacrificed.

SUMMARY OF THE INVENTION

The present invention solves the above problems in the conventional circuit and has an object to provide a matched filter in which the total circuit can be refreshed without decreasing the calculation speed.

A matched filter according to the present invention contains:

a main sampling and holding circuit containing a plurality of sampling and holding circuit modules;

a plurality of auxiliary sampling and holding circuits for holding a part of an analog input voltage which is to be held in the modules in the main sampling and holding circuit;

first and second addition and subtraction circuits for receiving outputs from the main sampling and holding circuit;

a multiplexer for alternatively outputting an output of the first addition and subtraction circuit or the second addition and subtraction circuit; and a refreshing means for refreshing the sampling and holding circuit modules while the auxiliary sampling and holding circuits hold the input voltage. Consequently, the operation of a sampling and holding circuit module and addition and subtraction circuit in the main sampling and holding circuit is stopped for a period of time, and a refresh operation in the main sampling and holding circuit is performed during this time while an auxiliary sampling and holding circuit holds the input voltage.

It is possible to obtain a higher accuracy calculation while keeping a high calculation speed with the matched filter according to the present invention.

PREFERRED EMBODIMENT OF THE PRESENT INVENTION

Hereinafter the first embodiment of a matched filter according to the present invention is described with reference to the attached drawings.

Figure 1:
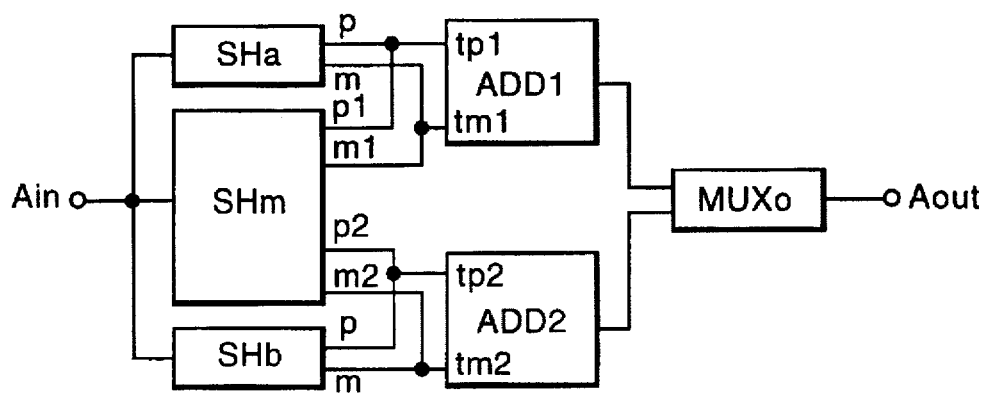
FIG. 1 shows a block diagram of a matched filter of the first embodiment according to the present invention.
Figure 17:
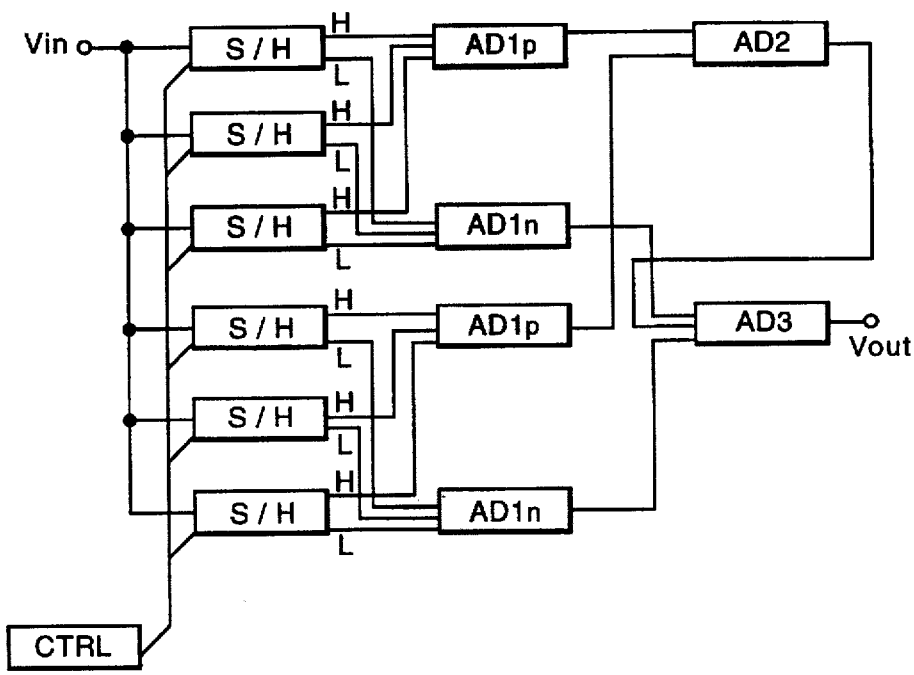
FIG. 17 shows a block diagram of a conventional matched filter.
Figure 18:
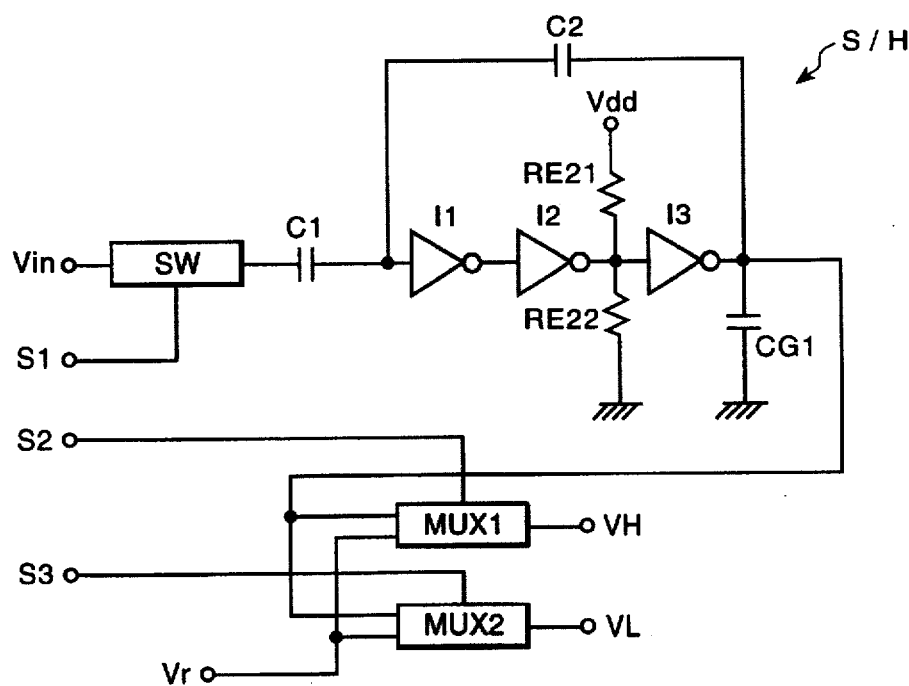
FIG. 18 shows a sampling and holding circuit of a conventional matched filter.

In FIG. 1, a matched filter includes auxiliary sampling and holding circuits SHa and SHb in addition to a main sampling and holding circuit SHm which is similar to a conventional sampling and holding circuit (with a plurality of S/Hs in FIG. 17). The auxiliary sampling and holding circuits hold data which is originally held in the main sampling and holding circuit while portions of the main sampling and holding circuit are being refreshed. That is, the auxiliary sampling and holding circuit can be used for holding the input voltage during the refreshing operation instead of one of sampling and holding circuit modules in the main sampling and holding circuit. Therefore, it is possible to sequentially stop and refresh sampling and holding circuits one after another in the modules of the main sampling and holding circuit. Since two auxiliary sampling and holding circuits SHa and SHb are provided, the auxiliary sampling and holding circuits can be used alternately to hold the main circuit data.

Outputs of sampling and holding circuits SHm and SHa are input to the first addition and subtraction circuit ADD1, and those of SHm and SHb are input to the second addition and subtraction circuit ADD2. These addition and subtraction circuits perform addition and subtraction in a similar manner as the conventional addition and subtraction circuit. In FIG. 1, the plus and minus outputs of SHa and SHb are indicated by p and m. The plus and minus outputs of SHm sent to ADD1 are indicated as p1 and m1, and the plus and minus outputs sent to ADD2 are indicated as p2 and m2. One of the two addition and subtraction circuits can be stopped when an output of the other addition and subtraction circuit is output. Then outputs of addition and subtraction circuits ADD1 and ADD2 are alternately output from a multiplexer MUXo as an analog output voltage Aout.

Figure 2:
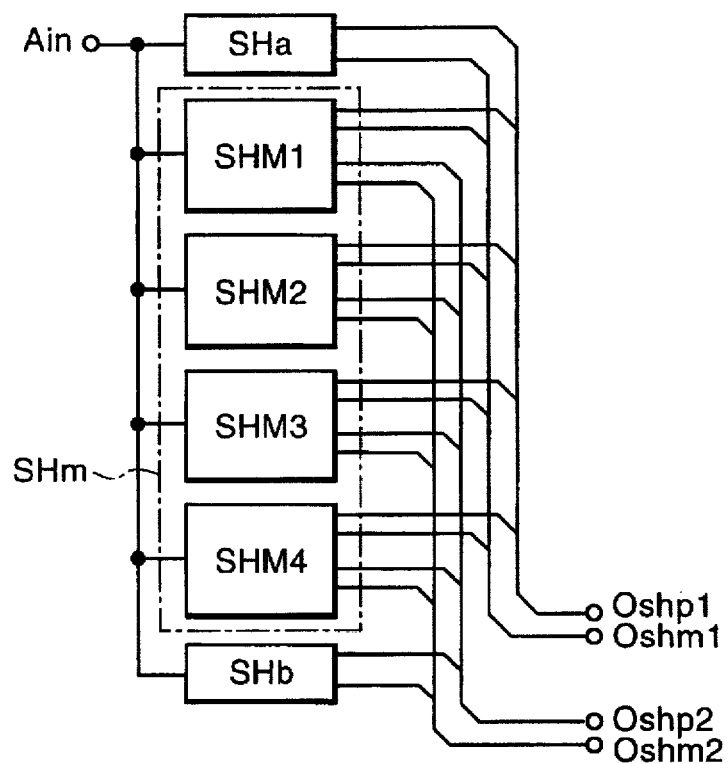
FIG. 2 shows a block diagram of the main sampling and holding circuit of the embodiment in FIG. 1.

FIG. 2 shows the main sampling and holding circuit SHm in detail, in which auxiliary sampling and holding circuits are also shown. The main sampling and holding circuit SHm includes four sampling and holding circuit modules SHM1, SHM2, SHM3 and SHM4. These sampling and holding circuit modules generate two kinds of outputs p and m according to the PN code to be multiplexed by the held data. These outputs are input to ADD1 and ADD2, respectively, by integrating the outputs of SHa and SHm, and also the outputs of SHb and SHm. Here it is defined that a plus element and a minus element to be input to ADD1 are Oshp1, Oshm1, respectively, and the plus and minus elements to be input to ADD2 are Oshp2 and Oshm2, respectively. Input terminals of a plus element and a minus element of ADD1 are tp1 and tm1, respectively, and those of ADD2 are tp2 and tm2, respectively.

Figure 3:
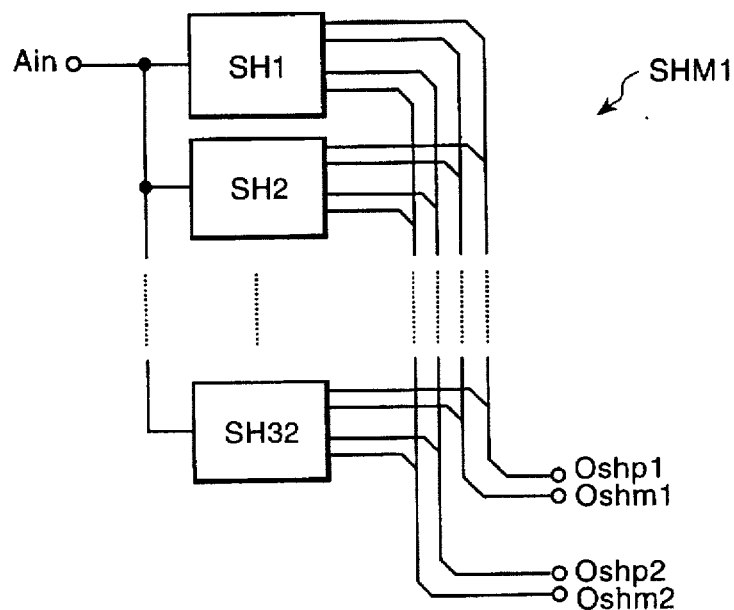
FIG. 3 shows a block diagram of a sampling and holding circuit module in the main sampling and holding circuit of the embodiment in FIG. 1.

As in FIG. 3, a sampling and holding circuit module contains unit sampling and holding circuits SH1 to SH32. Consequently, it is possible to hold 128 units of data in the main sampling and holding circuit SHm (32×4=128). Since sampling and holding circuit modules SHM2 to SHM4 have the same structure as SHM1, the detailed description of SHM2 through SHM4 is omitted.

Figure 4:
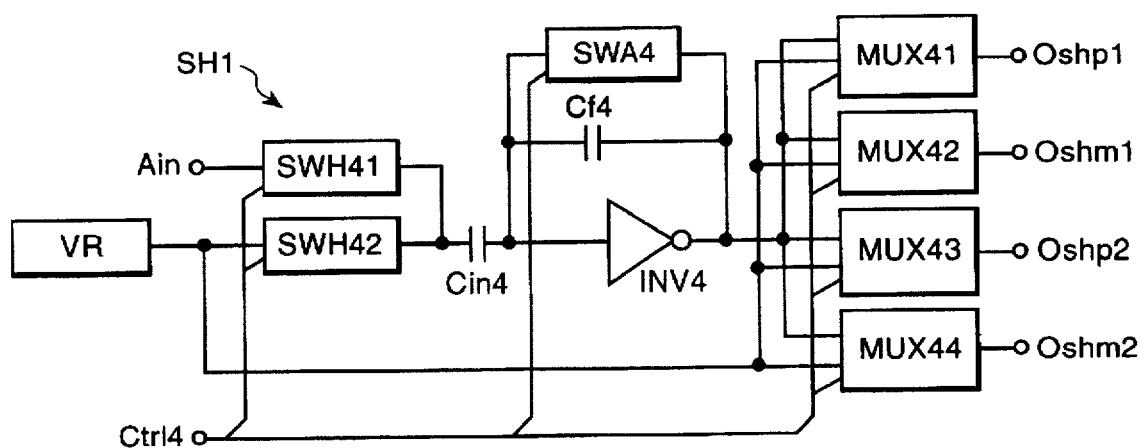
FIG. 4 shows a unit sampling and holding circuit of the main sampling and holding circuit in FIG. 3.

As shown in FIG. 4, a unit sampling and holding circuit SH1 includes an input switch SWH41 connected to the input voltage Ain and an input capacitance Cin4 connected to the input switch. The input capacitance is input to an inverter INV4 having three stages of serial MOS inverters. An output of the inverter INV4 is fed back to its own input through feedback capacitance Cf4. The linearity of the relationship between the inventer input and the inverter output is maintained by a high open loop gain of INV4. INV4 is similar to the circuit described in applicants' prior application Japanese laid open publication number 7-94957, which obtains high gain by using three stags of MOS inverters and prevents unnecessary oscillation by using a grounded capacitance and a balancing resistance. When data is held by a unit sampling and holding circuit, SWH41 is opened after closing, an electric charge is held in capacitances Cin4 and Cf4, and an input voltage Ain is output from the output terminal of INV4. The ratio of capacitances Cin4 and Cf4 is 1:1, and an inverted value of input voltage Ain is output from INV4. To the output of INV4, multiplexers MUX41, MUX42, MUX43 and MUX44 are connected, which correspond to Oshp1, Oshm1, Oshp2 and Oshm2. Only one of multiplexers outputs the input voltage; Ain the other multiplexers output the reference voltage. The reference voltage is the reference of the output voltage, which corresponds to 0.

The unit sampling and holding circuit includes switches SWH42 and SWA4, which are controlled by a controlled signal Ctrl4 and are used for refreshing the unit sampling and holding circuit SH1. Multiplexers MUX41 to MUX44 are also controlled by control signal Ctrl4. SWH42 is for connecting VR to Cin4 and SWA4 is for short-circuiting the input and output of INV4. SH1 is refreshed and the voltage offset is canceled by closing the switches to dissipate residual charge in the circuits. Since SH1 cannot hold and output Ain during refreshing, SHa or SHb is used to hold Ain while SH1 is being refreshed. When refreshing is performed, MUX41 to MUX44 output the reference voltage to the addition and subtraction circuits.

Since unit sampling and holding circuits SH2 to SH32 have the same structure as SH1, their detailed description is omitted.

Figure 5:
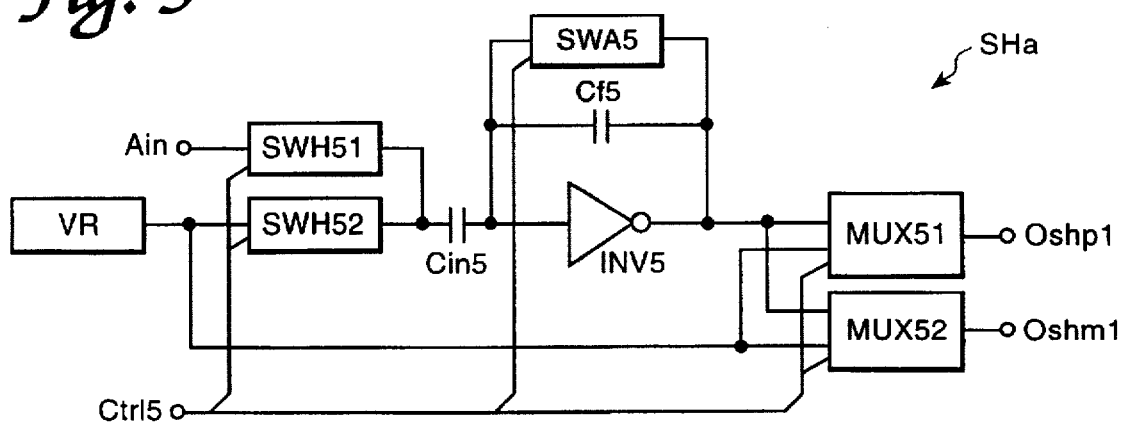
FIG. 5 shows an auxiliary sampling and holding circuit in the embodiment.

As shown in FIG. 5, auxiliary sampling and holding circuit SHa is a circuit having a similar structure as the unit sampling and holding circuit. The difference is that the number of multiplexers in the auxiliary sampling and holding circuit is two, not four. Auxiliary sampling and holding circuit SHa outputs only Oshp1 and Oshm1 which are output to ADD1. In FIG. 5, SWH51 is switch for connecting Ain to an input capacitance Cin5, SWH52 is a switch for connecting VR to capacitor Cin5, INV5 is a three stage MOS inverter circuit connected to Cin5, SWH5 is a switch for short circuiting an input and output of INV5, MUX51 is a multiplexer for outputting an output of INV5 as Oshp1, and MUX52 is a multiplexer for outputting an output of INV5 a Oshm1. The ratio of the values of capacitors Cin5 and Cf5 is 1:1. The inverse of input voltage Ain is output from INV5.

Switches SWH51, SWH52, SWA5, and multiplexers MUX51 and MUX52 are controlled by a control signal Ctrl5. When the refresh operation is performed, SWH51 is opened, SWH52 is closed, SWA5 is closed, and MUX51 and MUX52 output the reference voltage. An offset voltage consequently is reduced by the refresh operation and an addition and subtraction circuit outputs the reference voltage. The auxiliary sampling and holding circuit SHb generates outputs Oshp2 and Oshm2 for ADD2 by a similar structure.

Figure 6:
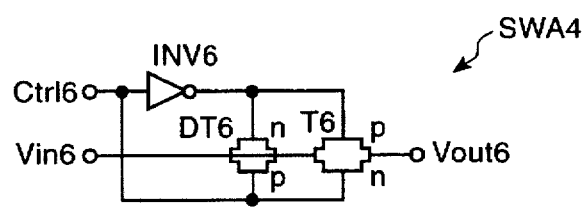
FIG. 6 shows a circuit of a switch.

In FIG. 6, the switch SWA4 (in FIG. 4) switches a transistor circuit T6 containing pMOS and nMOS transistors having the drains and sources connected together. The source of the pMOS and drain of the nMOS are connected to each other and both the pMOS and the nMOS are controlled by a control signal Ctrl6. An input voltage Vin6 is sent to the drain of pMOS of T6 through a dummy transistor DT6. Ctrl6 is input to the gates of the pMOS T6 and nMOS DT6, as well as to the gates of pMOS T6 and nMOS DT6 through an inverter INV6. T6 is closed when Ctrl6 is at a high level. DT6 contains MOSs which are parallelly connected with and have an inverse polarity compared with the MOSs in T6. DT6 cancels the offset of Cin4 and makes the output of Vout6 more accurate. Since switch SWA5 has the same structure as SWA4 its detailed description is omitted here.

Figure 7:
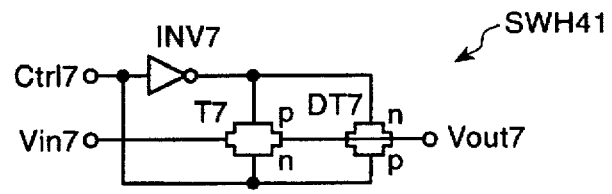
FIG. 7 shows a circuit of another switch.

In FIG. 7, a switch SWH41 (shown in FIG. 4) is structured by inverting the arrangement of the transistor and dummy transistor in SWA4. Switch SWH41 can cancel the offset of the output voltage. T7 is a MOS switch in which an nMOS and a pMOS are connected in parallel with the input voltage Vin. DT7 is a dummy transistor for outputting an inverse polarity of the MOSs in T7 to an output of T7, and INV7 is an inverter for inputting a control signal Ctrl7 to a pMOS in T7 and nMOS in DT7. Since switches SWH42, SWH51 and SWH52 are the same as the switch SWH41, a detailed description of them is omitted here.

Figure 8:
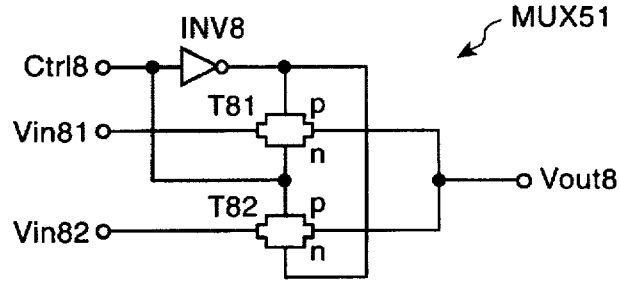
FIG. 8 shows a circuit of a multiplexer.

In FIG. 8, a multiplexer MUX51 (shown in FIG. 5) switches two of the parallel MOS switches using a control signal and an inverted control signal having an inverse polarity of control signal. MOS switches T81 and T82 are arranged such that the pMOS and nMOS are connected in parallel with input voltages Vin81 and Vin82. A control signal Ctr18 is input to a gate of nMOS T81 and a gate of pMOS T82, and also input to a gate of pMOS T81 and a gate of nMOS T82 through an inverter INV8. When Ctr18 is at a high level, T81 is closed, and when Ctr18 is at a low level, T82 is closed. Input voltage Vin81 or Vin82 is output as an output Vout depending on whether T81 or T82 is closed. Since multiplexers MUXo, MUX41, MUX42, MUX43, MUX44 and MUX52 have the same structure and operation as MUX51, the detailed description of them is omitted.

Figure 9:
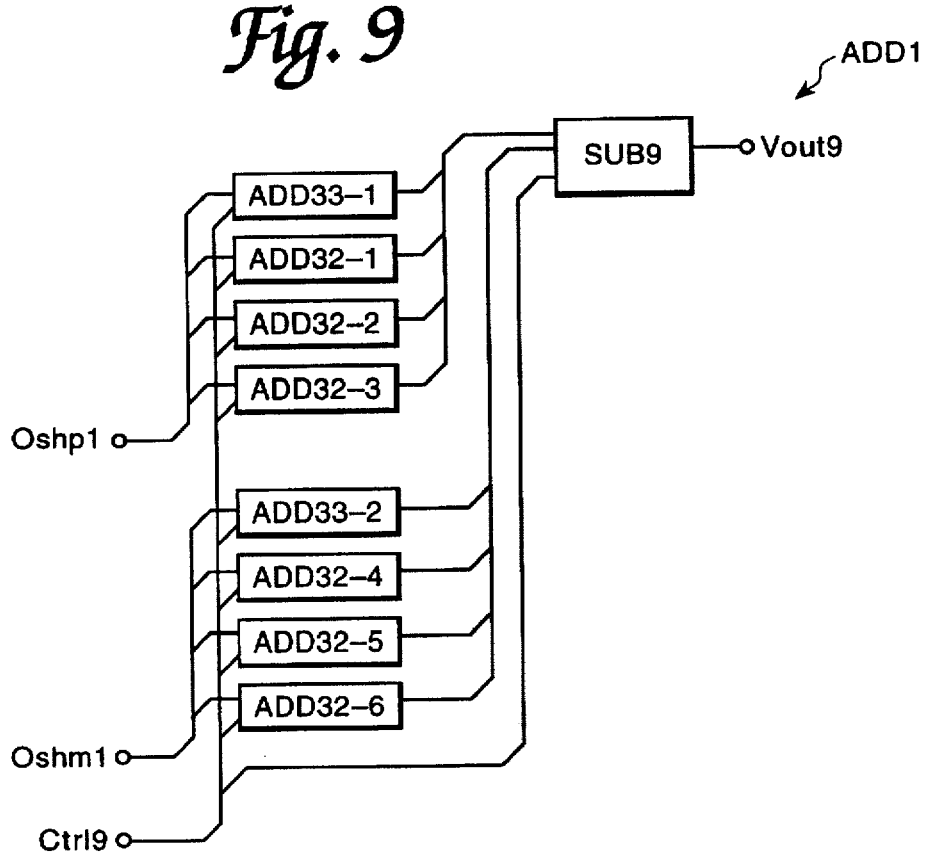
FIG. 9 shows a block diagram of an addition and subtraction means.

In FIG. 9, the addition and subtraction means ADD1 (shown in FIG. 1) includes four addition portions ADD33-1, ADD32-1, ADD32-2 and ADD32-3, for adding Oshp1, and also includes four addition portions ADD33-2, ADD32-4, ADD32-5 and ADD32-6 for adding Oshp1. Additional portions ADD33-1 and ADD33-2 are addition portions having inputs which add the plus and minus outputs of SHM1 and SHa. ADD32-1, ADD32-2 and ADD32-3 are addition portions having 32 inputs which add the plus outputs of SHM2, SHM3 and SHM4. ADD32-4, ADD32-5 and ADD32-6 are addition portions having 32 inputs which add the minus outputs of SHM2, SHM3 and SHM4. The addition results of Oshp1 and Oshm1 are input to SCB9, and the addition result of Oshm1 is subtracted from the addition result of Oshp1. The stopping and refreshment of addition and subtraction means ADD1 is controlled by a control signal Ctr19 in the same order in which the multiplexers MUX41 and MUX42 (shown in FIG. 4) in the main sampling and holding circuit SHm, and the MUX51 and MUX52 (shown in FIG. 5) in the auxiliary sampling and holding circuit SHa, corresponding to MUX41 and MUX42, respectively, output the reference voltage. Therefore, if all the outputs of addition circuits (and all the inputs of subtraction circuits) are the reference voltage, then the addition and subtraction circuit ADD1 outputs the reference voltage as Vout9. Since ADD2 is the same as ADD1, the description is omitted.

Figure 10:
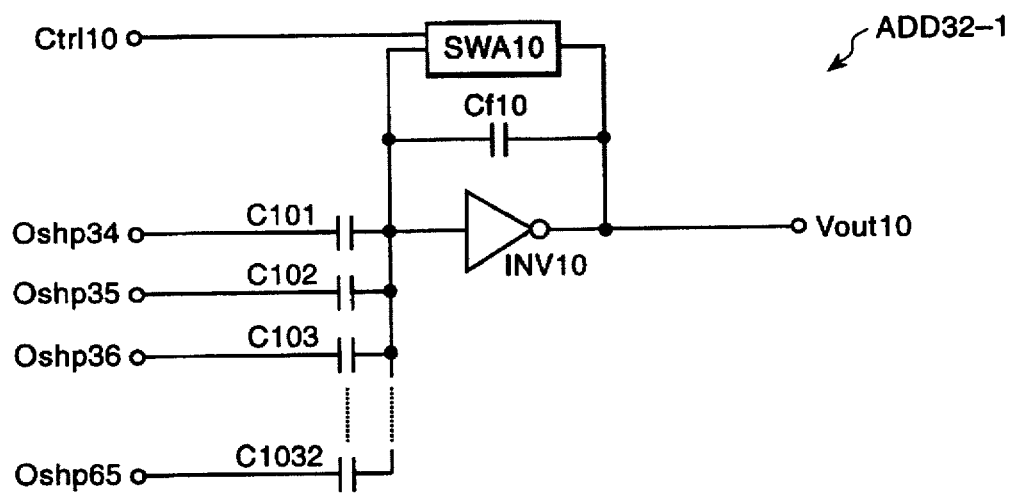
FIG. 10 shows a circuit of an addition portion.

In FIG. 10, ADD32-1 includes a capacitive coupling in which 32 capacitances from C101 to C1032 are connected in parallel to inverter circuit INV10. The capacitances in ADD32-1 all have the same value. The inverter circuit INV10 consists of three stages of MOS inverters. An output of INV10 is fed back to its input through a feedback capacitance Cf10 and is also output as an inverter output Vout10, which is an inverted linear output of the capacitive coupling. The capacitance ratio of capacitances C101 to C1032 and Cf10 is 1:32. For example when the same input voltage is input to capacitors C101 to C1032, the inverter INV10 outputs a voltage equal to the input voltage. Also a switch SWA10 (having the structure as switch SWA4) for short-circuiting the inverter input and output is connected to INV10 and refreshes ADD32-1 when the INV10 is closed by a control signal Ctrl10. Since ADD32-2 to ADD32-6 are the same as ADD32-1, the description is omitted.

Figure 11:
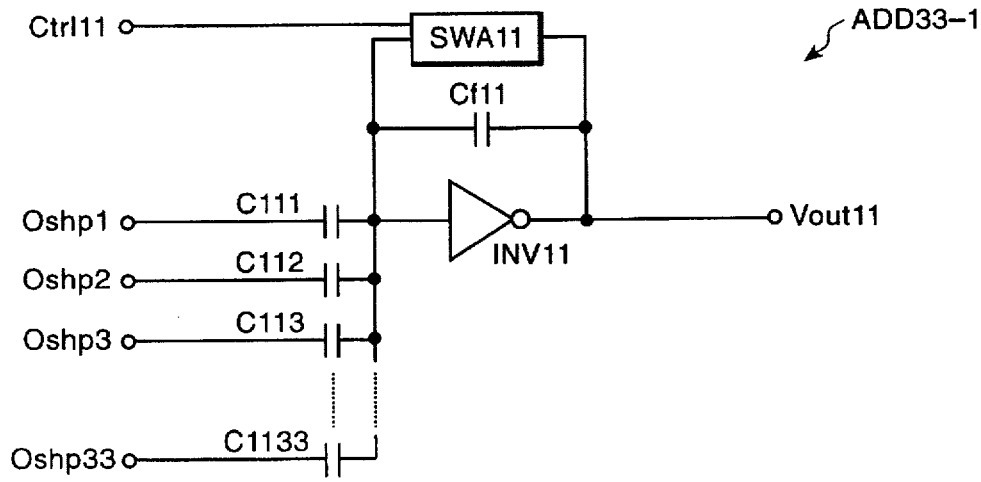
FIG. 11 shows a circuit of another addition circuit.

In FIG. 11, ADD33-1 includes a capacitive coupling in which 33 capacitances from C111 to C1133 are connected in parallel and have the same values as the capacitors in ADD33-1. An output of the capacitive coupling is connected to an inverter circuit INV11 containing three stages of MOS inverters. An output of INV11 is fed back to its input through a feedback capacitance Cf11, and is also output as an output Vout11, which is an inverted linear output of the capacitive coupling. The capacitance ratio of capacitances C111 to C1133 and Cf11 is 1:32. The same weight is given to ADD32-1 and ADD33-1. If an invalid input (the reference voltage) is input to one of the capacitors C111 to C1133, the capacitor receiving the invalid output is ignored in determining the capacitance ratio.

For example, when the same input voltage is applied to capacitors C111 to C1133, the inverter INV11 outputs as an inverted output of the input voltage. Also a switch SWA11 (the structure is the same as SWA4) for short-circuiting the inverter input and output is connected to INV11 and refreshes ADD33-1 when the inverter INV11 is closed by a control signal Ctrl11. Aa mentioned above, all the inputs of the addition portions are the reference voltage when a refreshing is performed. Therefore, the reference voltage is also the output Vout11 because of the short circuit between the input and output of the inverter INV11. Since ADD32-2 is the same as ADD32-1, the description is omitted.

Figure 12:
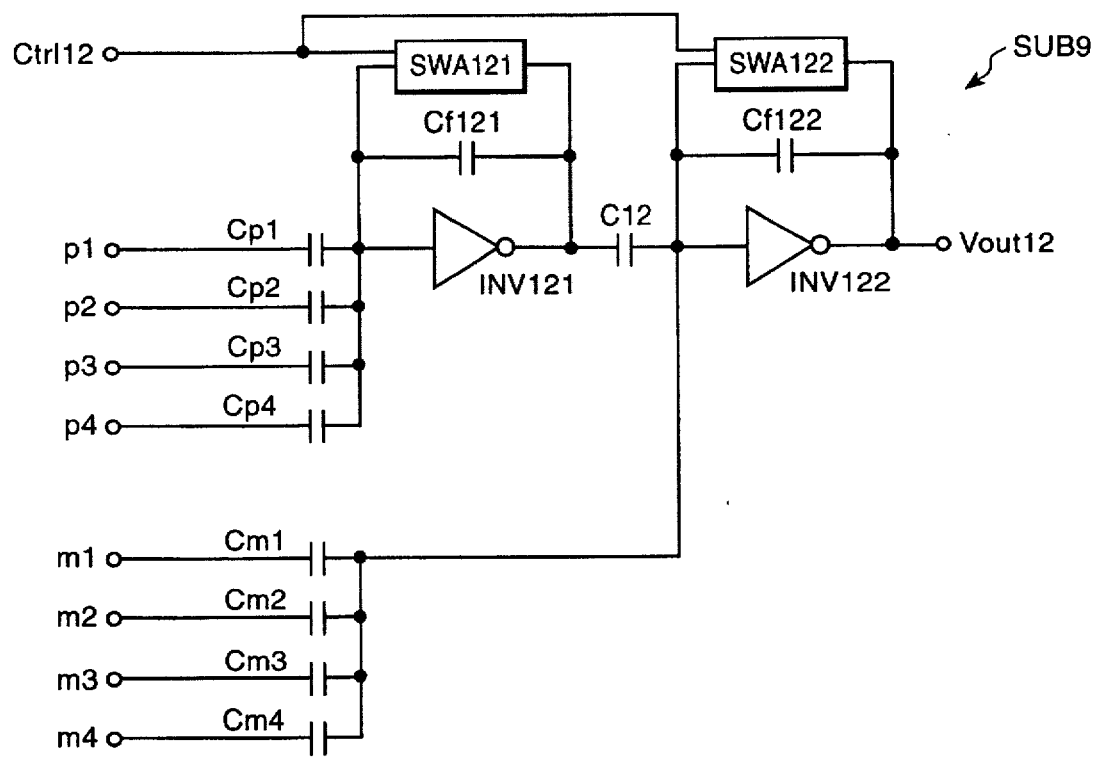
FIG. 12 shows a circuit of a subtraction circuit.

In FIG. 12, the subtracter SUB9 includes a capacitive coupling having four capacitances Cp1, Cp2, Cp3, Cp4 for adding the outputs of ADD33-1, ADD32-1, ADD32-2 and ADD32-3 (shown by p1, p2, p3 and p4 in the figure). An output of the capacitive coupling is connected to an inverter circuit INV121 having three stages of MOS inverters. An output of INV121 is fed back to its input through a feedback capacitance Cf121, to obtain a signal with good linearity. An inverter circuit INV122 which is similar to INV121 is connected to the following stage to the INV122 through a capacitance C12. A capacitive coupling consisting of capacitances Cm1, Cm2, Cm3 and Cm4 is connected to INV122. A feedback capacitance Cf122 is also connected to INV122. The minus outputs of ADD33-2, ADD32-4, ADD32-5 and ADD32-6 are input to the capacitances, and the addition results of the capacitor inputs are output. An output of INV121 is the inverse of the addition result of p1 to p4. INV121 is added to the sum of m1 to m4 in C12 and the capacitive coupling including Cm1 to Cm4. Since the addition result is inverted by inverter INV122, the addition result of m1 to m4 is subtracted from the addition result of p1 to p4, and the subtraction result is output as Vout12 of the output of INV122. The ratio of the values of each capacitance Cp1 to Cp4 and Cf121 is 1:4. For example, when the same input voltage is input to Cp1 to Cp4, INV121 outputs a voltage equal to each input voltage. The capacitor ratio of each capacitance Cm1 to Cm4, capacitance C12, and Cf122 is 1:4:4. Inputs of Cp1 to Cp4 and of Cm1 to Cm4 are equally weighted. For example, when all of the inputs have the same plus or minus value, the final output Vout12 is equal to the input. INV121 and INV122 are connected to switches for refreshing SWA121 and SWA122, and are controlled by a control signal Ctr122.

Figure 13:
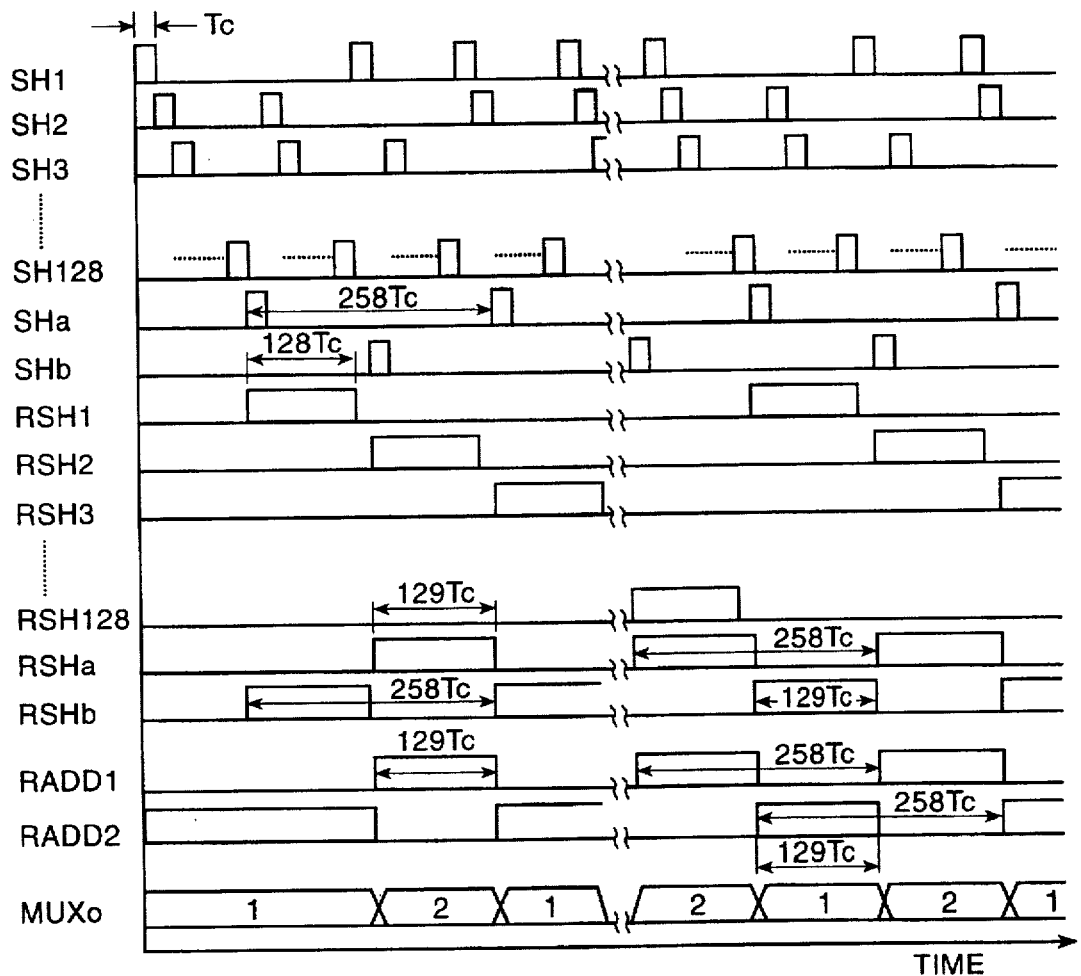
FIG. 13 shows a timing chart of the actions in the embodiment.

As shown in FIG. 13, the matched filter described above intermittently refreshes one of sampling and holding circuits as well as performs successive sampling and holding of an analog input in a sampling and holding circuit. In FIG. 13, time lines SH1 to SH128 show the timings of each unit sampling and holding circuit SH1 to SH128, and time lines SHa and SHb show the timings of auxiliary sampling and holding circuits SHa and SFb. Tc, which is the period of one sampling and holding operation, is enough time for changing capacitances in a sampling and holding circuit (Cin4 and Cf4 in FIG. 4). The sampling and holdings are successively performed by unit sampling and holding circuits SH1 to SH128 in the first period. The broken line shown before SH128 indicates the omission of the periods for SH4 to SH127 for brevity. Sampling and holdings by auxiliary sampling and holding circuit SHa are performed after the first period. If the sampling and holding were performed during the same timing as the first period, SH1 would perform sampling and holding; however SH1 is stopped. The timings of refreshing operations for SH1 to SH128 are shown by time lines RSH1 to RSH128. As shown by RSH1, SH1 is refreshed when it stops sampling and holding. In the third period, SH2 stops and the auxiliary sampling and holding circuit SHb is used instead of SH2 to hold the sampled signal, and SH2 is refreshed during this time. Similarly, one of unit sampling and holding circuit SH3 to SH128 successively stops and is refreshed during each period. SHa and SHb are alternatively used to hold the sampled signal instead of the stopped unit sampling and holding circuit being refreshed. When Tc is considered a single time unit, the holding time of SHa and SHb is Tc, and the period is 258 Tc. The holding time of RSH1 to RSH128 is 128 Tc, and the period is 129×128 Tc.

With respect to auxiliary sampling and holding circuits SHa and SHb, one is refreshed when another is used. In FIG. 13, the refreshing timings of SHa and SHb are shown by RSHa and RSHb, respectively. For example, the refreshing of SHb is started in the second period and it is continued until just before SHb is used in the third period. After that, SHb is refreshed until just before SHa is used, and SHa is refreshed until just before SHb is used. They are alternately refreshed in this way. The holding time of RSHa and RSHb is 130 Tc, and the period is 258 Tc.

As shown in FIGS. 2 and 9, auxiliary sampling and holding circuits SHa and SHb are connected to addition and subtraction circuits ADD1 and ADD2, respectively. Therefore, it is necessary to select an addition and subtraction circuit corresponding to the auxiliary sampling and holding circuit. That is, when SHa is used, ADD1 is selected, and when SHb is used, ADD2 is selected. While one of the addition and subtraction circuits is used, another one is refreshed. In FIG. 13, RADD1 and RADD2 show the timing of refreshing of ADD1 and ADD2, respectively, The holding time and the period of RADD1 and RADD2 is 129 Tc and 258 Tc, respectively.

The multiplexer MUXo selects an output of a selected addition and subtraction circuit and outputs the effective data as Aout.

Figure 14:
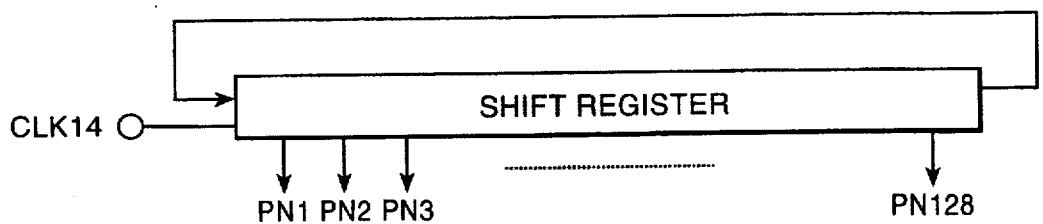
FIG. 14 shows a circuit for generating PN codes.

The PN codes for multiplying an analog input voltage are used by every period in rotation. The PN code for each unit sampling and holding circuit is stored in a shift register as shown in FIG. 14. A clock CLK14 is input to the shift register over one period of sampling and holding. The PN codes are shifted at every input. The PN codes which reach the end of the shift register are sent back to the start end. In the figure, the PN code associated with unit sampling and holding circuits SH1, SH2, SH3, . . . SH128 are shown in FIG. 14 by PN1, PN2, PN3, . . . ,PN128.

Figure 15:
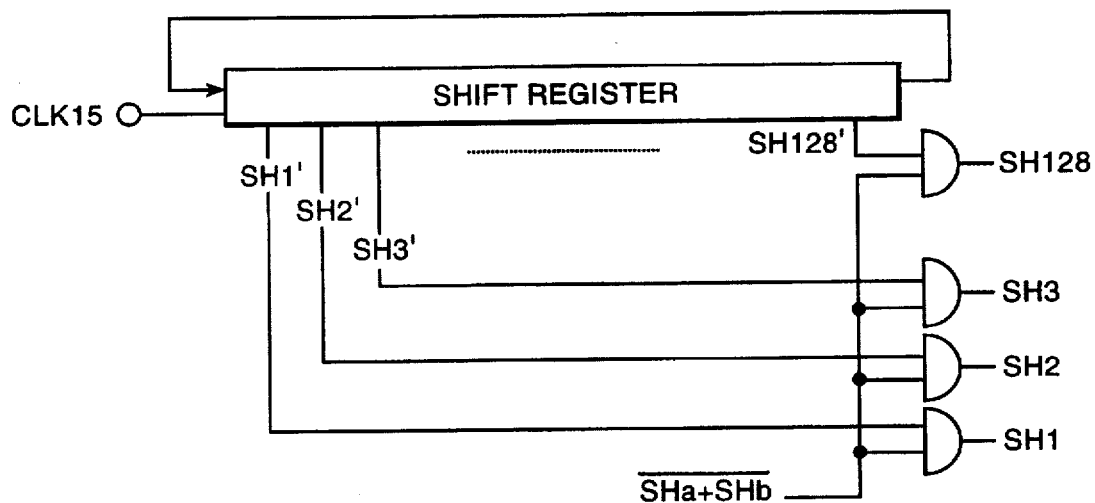
FIG. 15 shows a circuit for generating a sampling and holding signal in the main sampling and holding circuit.

The signal for making each unit sampling and holding circuit perform sampling and holding consists of one signal of 1 and 127 signals of 0. The sampling and holding circuit to which the signal 1 is input performs the sampling and holding. The signal is stored in a shift register circuit in FIG. 15. The sampling and holding of the remaining unit sampling and holding circuits is performed by rotating the signal as shown in FIG. 14. When the auxiliary sampling and holding circuits are changed, since the sampling and holding have to be stopped, the NOR of SHa and SHb and AND of each sampling and holding signal is the final sampling and holding signal. In FIG. 15, SH1 to SH128 are the final sampling and holding signals, and SH1' to SH128' are the signals in a predetermined period before the AND operation is executed on auxiliary sampling and holding circuits.

Figure 16:
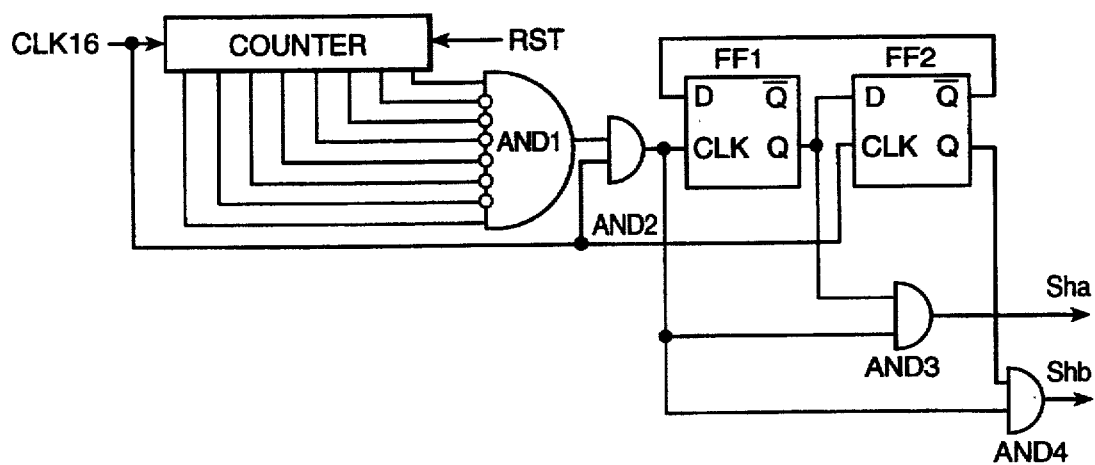
FIG. 16 shows a circuit for generating a sampling and holding signal in an auxiliary sampling and holding circuit.

FIG. 16 shows a circuit for generating sampling and holding signals of SHa and SHb. When an output of an 8 bit-counter (shown by COUNTER) is 129 ("10000001" in binary rotation), the output is judged by AND1 of the first AND circuit, and the AND of the judgement and a clock CLK16 common to the counter is generated by AND2 of the second AND circuit. It is a pulse generated every 129 times of sampling and holding. The pulse is input to a flip-flop FF1, whose output Q is input to the data input of the second stage flip-flop FF2. The inverse output of FF2 is input to a data input of FF1. The auxiliary sampling and holding circuit SHa is generated by a circuit AND3 to which an output Q of FF1 and an output of AND2 are input. Similar to SHa, the sampling and holding signal SHb is generated by a circuit AND4 to which an output Q of FF2 and an output of AND2 are input.

In the invention, a sampling and holding circuit and addition and subtraction circuit in the main sampling and holding circuit is stopped for a certain period of time. A refresh is performed during this period. As an auxiliary circuit holds the signal held by the main sampling circuit. Therefore, it is possible to obtain higher calculation accuracy and keep high speed calculation in the matched filter according to the present invention.

What is claimed is:

1. A matched filter comprising:
    a main sampling and holding circuit with a plurality of sampling and holding circuit modules parallelly connected to an input voltage for holding said input voltage, each of said sampling and holding circuit modules having first and second outputs corresponding to first and second values of a PN code;
    a first adder for adding said first outputs of said sampling and holding circuit modules;
    a second adder for adding said second outputs of said sampling and holding circuit modules;
    a first addition and subtraction circuit for subtracting an output of said second adder from an output of said first adder;
    a plurality of auxiliary sampling and holding circuits for sampling and holding a part of said input voltage to be sampled and held by one of said sampling and holding circuit modules in said main sampling and holding circuit;
    a second addition and subtraction circuit having circuits equivalent to those of said first addition and subtraction circuit;
    a multiplexer for alternately outputting an output of one of said first and second addition and subtraction circuits and;
    a refreshing means for refreshing one of said sampling and holding circuit modules in said main sampling and holding circuit for which said auxiliary sampling and holding circuits hold said input voltage, and for refreshing the other of said first and second addition and subtraction circuits which was not selected by said multiplexer, wherein outputs of said sampling and holding circuit modules and said auxiliary sampling and holding circuits are input in both of said first and second addition and subtraction circuits.

2. A matched filter as claimed in claim 1, wherein said plurality of auxiliary sampling and holding circuits comprises first and second auxiliary sampling and holding circuits, each of which samples and holds said input voltage such that one of said first and second auxiliary sampling and holding circuits is refreshed while the other of said first and second auxiliary sampling and holding circuits holds said input voltage.

3. A matched filter as claimed in claim 1, wherein said refresh means successively refreshes one sampling and holding circuit module in said main sampling and holding circuit.

4. A matched filter as claimed in claim 1, wherein each of said sampling and holding circuit modules comprises a plurality of unit sampling and holding circuits.

5. A matched filter as claimed in claim 4, wherein each of said unit sampling and holding circuits comprises:

an input switch receiving the input voltage;

an input capacitance connected to the switch;

an inverter stage having an inverter input connected to the input capacitance and an inverter output which is connected to the inverter input;

a plurality of refreshing switches which are controlled by a control signal; and a plurality of multiplexers controlled by the control signal, each multiplexer generating a multiplexer output and sending the multiplexer output to said first and second addition and subtraction circuits, wherein one of said auxiliary sampling and holding circuits holds said input voltage held by a selected unit sampling and holding circuits while said selected unit sampling and holding circuit is being refreshed.

6. A matched filter as claimed in claim 1, wherein each of said auxiliary sampling and holding circuits comprises:

an input switch receiving the input voltage;

an input capacitance connected to the switch;

an inverter stage having an inverter input connected to the input capacitance and an inverter output which is connected to the inverter input;

a plurality of refreshing switches which are controlled by a control signal; and a plurality of multiplexers controlled by the control signal, each multiplexer generating a multiplexer output and sending the multiplexer output to one of said first and second addition and subtraction circuits.

* * * * *